(12) United States Patent
Carder et al.

(10) Patent No.: US 9,366,724 B1
(45) Date of Patent: Jun. 14, 2016

(54) SCAN TESTING WITH STAGGERED CLOCKS

(71) Applicant: FREESCALE SEMICONDUCTOR, INC., Austin, TX (US)

(72) Inventors: Darrell L. Carder, Dripping Springs, TX (US); Rakesh Bakhshi, Faridabad (IN); Robert N. Ehrlich, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 8 days.

(21) Appl. No.: 14/566,823

(22) Filed: Dec. 11, 2014

(51) Int. Cl.
*G01R 31/28* (2006.01)
*G06F 11/00* (2006.01)
*G01R 31/3177* (2006.01)
*G01R 31/3185* (2006.01)
*G11C 7/10* (2006.01)
*G01R 31/317* (2006.01)

(52) U.S. Cl.
CPC ...... *G01R 31/3177* (2013.01); *G01R 31/31725* (2013.01); *G01R 31/318594* (2013.01); *G11C 7/1093* (2013.01)

(58) Field of Classification Search
CPC .............. G01R 31/3177; G01R 31/318594; G01R 31/318583; G01R 31/318552; G01R 31/318597; G01R 31/31727; G01R 31/31704; G01R 31/31725; G11C 7/1093; G11C 7/222; G11C 11/4076

USPC ......... 714/724, 726, 729, 731, 734, 744, 815, 714/814; 713/400, 401, 500, 501
See application file for complete search history.

(56) References Cited

U.S. PATENT DOCUMENTS

| | | | |
|---|---|---|---|
| 6,934,897 B2 | 8/2005 | Mukherjee et al. | |
| 7,797,561 B1* | 9/2010 | Abdalla | G06F 1/3203 713/322 |
| 7,840,861 B2 | 11/2010 | Sul | |
| 8,243,546 B2* | 8/2012 | Warren | G11C 5/063 365/233.11 |
| 8,458,544 B2 | 6/2013 | Wang et al. | |
| 8,769,359 B2* | 7/2014 | Wang | G06F 17/5045 703/14 |
| 2013/0091395 A1 | 4/2013 | Kukreja et al. | |

* cited by examiner

*Primary Examiner* — Christine Tu (57) ABSTRACT

The present disclosure provides system and method embodiments for generation of capture clock signals. A first and second test circuit receive a first test pattern and a functional clock signal. A first test clock control (TCC) circuit of the first test circuit generates a first capture clock signal that comprises a set of functional clock signal pulses generated according to a first clock pattern of the first test pattern. A second TCC circuit of the second test circuit generates a second capture clock signal that comprises the set of functional clock signal pulses generated according to the first clock pattern. The set of functional clock signal pulses of the second capture clock signal are staggered in time from the set of functional clock signal pulses of the first capture clock signal.

20 Claims, 3 Drawing Sheets

SCAN TESTING WITH STAGGERED CLOCKS

BACKGROUND

1. Field

This disclosure relates generally to scan testing, and more specifically, to scan testing with staggered clock.

2. Related Art

Scan testing of a system on a chip (SoC) is commonly used to perform at-speed transition pattern based testing. Electronic design automation (EDA) tools use Automatic Test Pattern Generation (ATPG) to generate and provide scan patterns to scan chains of on SoC. For scan testing, scan patterns are shifted into scan chains during a shift phase in which a shift clock is used to control the shifting of the scan chains, and a capture clock is used for at-speed transition testing during capture phases. Within an SoC, each core may have any number of scan chains. The capture clock in each core is controlled by a corresponding capture clock control chain. Scan testing for SoCs has been improved by the reuse of generated scan patterns at the core level. For example, multiple cores on an SoC may reuse the same scan patterns. However, for at-speed transition pattern based testing, there can be a current-resistance (IR) drop issue during the capture phases of the scan testing when multiple cores are scan tested in parallel and the capture clocks are aligned.

One solution to the IR issues for parallel scan testing of multiple cores is to use different test pattern data controlling the capture clocks to reduce their alignment. However, the need for different test pattern data for controlling the capture clocks prevents the ability to retarget the received test patterns at one set of input pins of the SoC by simply fanning out the test patterns to all cores. That is, each core requires different test pattern data to be loaded into each core's capture clock control chain. This increases cost and complexity of the SoC and of scan pattern generation. Therefore, a need exists for improved scan testing which reduces IR drop due to the capture clocks.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Reuse of scan patterns for capture clock generation in an SoC during scan testing allows for reduced complexity. However, when the capture clocks of the scan chains of different cores in an SoC are controlled with the same clock pattern, potential IR drop issues may occur. In one embodiment, a clock controller in each core of the SoC receives the same clock pattern from the SoC test controller for scan testing. The clock controller may be programmably configured to introduce a delay into the capture clocks in which each core's clock controller introduces a different delay into the capture clocks. In this manner, alignment of the capture clocks across cores during scan testing can be prevented.

Figure 1:
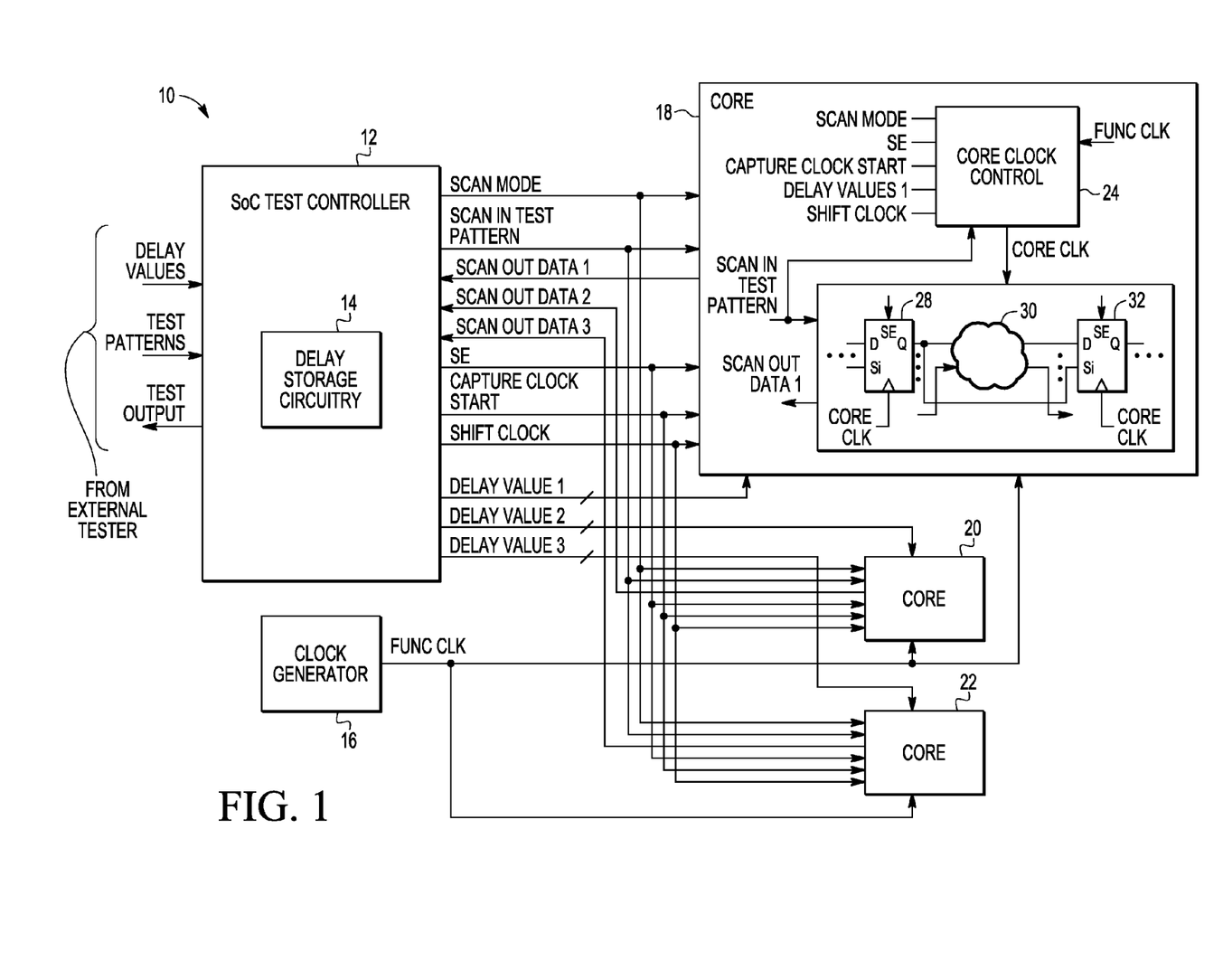
FIG. 1, in block diagram form, an SoC in accordance with an embodiment of the present invention.

FIG. 1 illustrates an SoC 10 having an SoC test controller 12, a clock generator 16, and cores 18, 20, and 22. SoC controller 12 is coupled to each of cores 18, 20, and 22, includes delay storage circuitry 14, and receives delay values and test patterns from an external tester and provides test outputs to the external tester. SoC test controller 12 provides a scan mode indicator to each core, which, when asserted, indicates that SoC 10 is in scan test mode for performing scan testing, and when negated, indicates that SoC 10 is operating in normal mode (non-scan test mode). SoC controller 12 also provides a scan in test pattern to each core, a scan enable (SE) indicator to each core, a shift clock to each core, and a capture clock start indicator. SoC test controller 12 provides delay value 1 to core 18, delay value 2 to core 20, and delay value 3 to core 22. SoC test controller receives scan out data 1 from core 18, scan out data 2 from core 20, and scan data out 3 from core 22. Clock generator 16 provides a functional clock (func clk) to each core.

Although only three cores are illustrated, SoC 10 may have any number of cores. Also, SoC 10 may include any other modules which may or may not include scan chains for scan testing.

In operation, SoC 10 can operate in normal mode or scan mode. When scan mode is not asserted, SoC 10 operates in normal mode, in which each of clock generator 16, and cores 18, 20, and 22, operate normally. During normal mode, cores 18, 20, and 22 operate in accordance with func clk. During scan mode, SoC test controller 12 communicates with each core to perform scan testing of the cores. For example, SoC test controller 12 provides scan in test patterns to each core, based on ATPG patterns received from an external tester, and, in response, receives scan out data which may then be provided as test output to the external tester. The external tester generates the ATPG patterns for scan testing SoC 10, and compares the received test output to expected test results to determine whether SoC 10 passes or fails the scan testing. SoC test controller also includes delay storage circuitry 14 which stores delay values provided from the external tester. These delay values are provided to each of cores 18, 20, and 22 as delay value 1, delay value 2, and delay value 3, respectively.

Core 18 includes a core clock controller 24 and logic under test (LUT) 26. Core clock control 24 receives func clk, the scan mode indicator, the SE indicator, the capture clock start indicator, delay value 1, and the shift clk. Core clock control 24 also receives the clock pattern which is provided by SoC test controller 12 as part of the scan in test patterns. Core clock control 24 provides a core clock (core clk) to LUT 26. LUT 26 includes a portion of logic within core 18 which is scan tested using the scan in test patterns and provides scan out data 1 which is returned to SoC test controller 12. LUT 26 may include any portion of core 18. LUT 26 includes a number of flip flops, such as flip flops 28 and 32, which are configured to operate as normal flip flops during normal mode (non-scan test mode) and as a scan chain during scan test mode (when scan mode is asserted). Each flip flop receives a data input, D, from a cone of logic coupled to the data input and provides a data output, Q, as an input into a cone of logic coupled to the data output. Also, each flip flop receives core clk at a clock input. Each flip flop also receives a scan input Si, and scan enable SE input.

For example, referring to LUT 26 in FIG. 1, a portion of a scan chain is illustrated which includes flip flops 28 and 32 and cone of logic 30. The D input of flip flop 32 is coupled to an output of cone of logic 30. Cone of logic 30 may include any number of logic gates to perform any type of function. Cone of logic 30 also receives an input from the Q output of flop flip 28, and may also receive inputs from the Q outputs of other flip flops. The Q output of flip flop 28 is also coupled to the Si input of flip flop 32. The Q output of flip flop 32 may be provided as an input to a subsequent cone of logic and to an Si input of a subsequent flip flop of the scan chain. The D input of flip flop 28 may receive an output of a preceding cone of logic. Also, other outputs from cone of logic 30 may be provided to other flip flops. Flip flops 28 and 32 correspond to a portion of a scan chain within core 18. The scan chain may include any number of flip flops, in which a beginning flip flop of the chain is coupled to receive the scan in test pattern from SoC test controller 12, and an ending flip flop of the chain is coupled to provide the scan out data to SoC controller 12. LUT 26 may include any number of scan chains.

During normal mode, SE is negated and the func clk is provided as the core clk to the flip flops. With SE negated, the D input of each flip flop is provided as the Q output of the flip flop with respect to core clk. Assuming the flip flop is a positive edge flip flop, the D input is provided as the Q output at the rising edge of core clk. Therefore, the logic of LUT 26 determines the value of each D input, in which core 18 operates normally. Also, since func clk is provided as the core clk, core 18 operates at the speed of the functional clock.

During scan mode, the flip flops are configured to operate as scan chains so that the logic of LUT 26 can be tested. During scan mode, SE can be asserted to provide a shift phase which is used to shift in the scan in test patterns in accordance with the shift clk. In this case, with each assertion of shift clk, the Si input is provided as the Q output of the flip flop. In this manner, scan in test patterns can be shifted into the scan chains. Also, with each assertion of shift clk, as scan in test patterns are being shifted in, scan out data is being shifted out of the chain. After a scan in test pattern has been shifted in, SE is negated such that the flip flops are configured as they are during normal mode and the capture phase can be performed. During the capture phase, the core clock is run at-speed (at the speed of the func clk) which causes the logic, such as logic 30, to transition with each clock transition as the data is captured in the flip flops. After a particular period of time or clock cycles of the func clk, SE is again negated such that the flip flops are again configured as scan chains and the next scan in test pattern can be shifted in as the just captured test data can be shifted out. During scan mode, as part of the scan in test pattern, a clock pattern in provided to core clock control 24. As the scan in test patterns are scanned into chains of LUT 26, the clock pattern is scanned into a clock control chain of core clock control 24. The clock pattern corresponds to the desired clock pattern of the clock during the capture phase. Therefore, core clk provided by core clock control 24 appropriately provides the clock signal to each of the flip flops in LUT 26 which control the flip flops during normal mode and during scan mode (including providing the appropriate clock signals during the shift and capture phases). Operation during scan mode will be described in more detail in reference to FIGS. 2 and 3.

Figure 2:
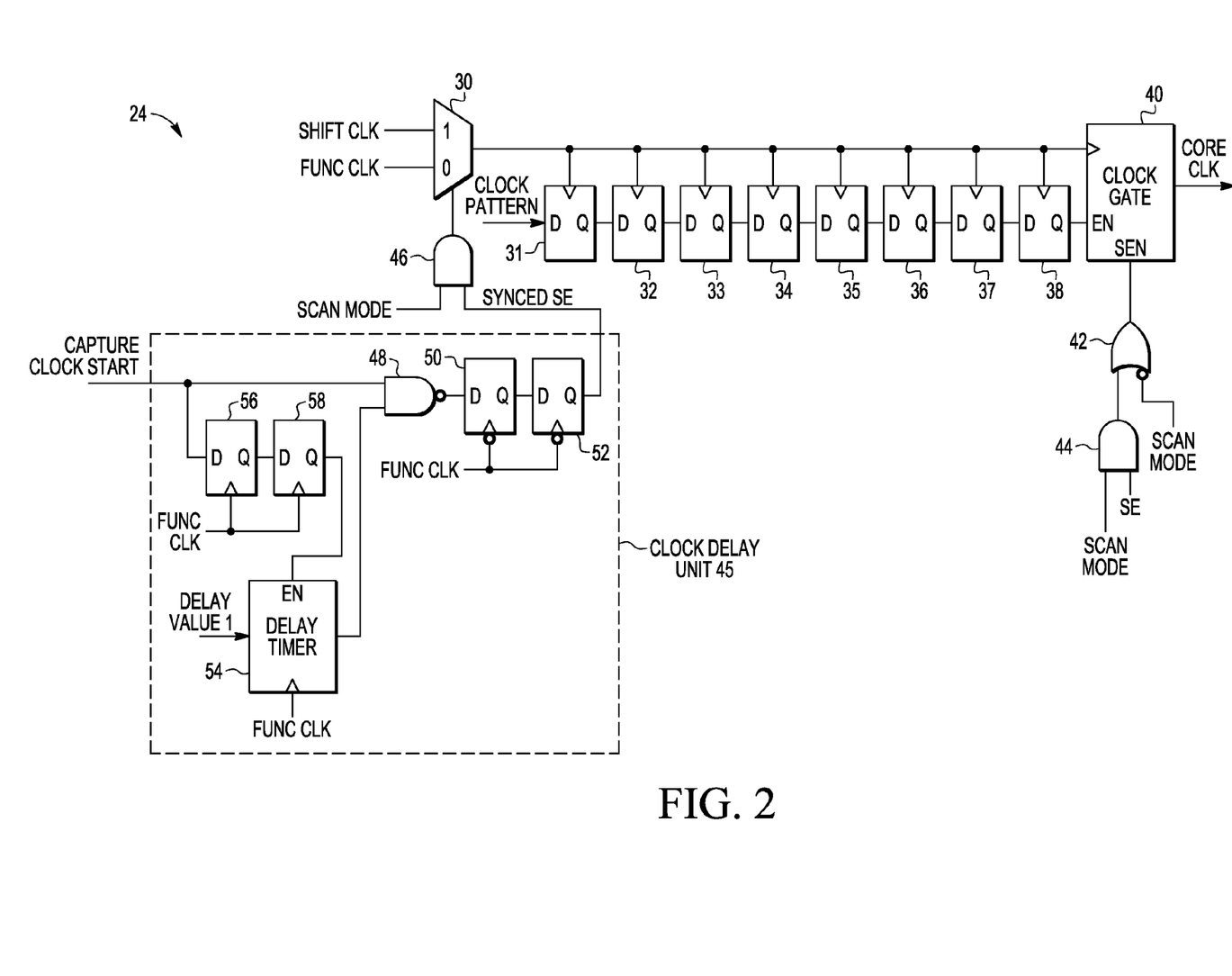
FIG. 2 illustrates, in schematic form, a core clock controller of a core of the SoC in accordance with one embodiment of the present invention.

FIG. 2 illustrates, in schematic form, core clock control 24 in further detail, in accordance with one embodiment of the present invention. Core clock control 24 (also referred to as a test clock control circuit) includes a clock control chain having flip flops 31-38, a multiplexer (MUX) 30, a clock gate 40, OR gate 42, AND gate 44, flip flops 50, 52, 56, and 58, NAND gate 48, AND gate 46, and a delay timer 54. A first data input of MUX 30 is coupled to receive shift clk, a second data input of MUX 30 is coupled to receive func clk, and a control input of MUX 30 is coupled to an output of AND gate 46. An output of MUX 30 is coupled to clock inputs of each of flip flops 31-38 and clock gate 40. A D input of flip flop 31 is coupled to receive a clock pattern, and a Q output of flip flop 31 is coupled to a D input of flip flop 32. Each of the D inputs of flip flops 32-38 are coupled to the Q outputs of flip flops 31-37, respectively, so as to form a clock control chain which operates as a shift register. Therefore, when the clock inputs of flip flops 31-38 receive a rising edge, the values in flip flops 31-38 are shifted one bit to the right. A Q output of flip flop 38 is coupled to an enable input, EN, of clock gate 40. Clock gate 40 provides core clock at its output. A first input of AND gate 44 is coupled to receive the scan mode signal and a second input of AND gate 44 is coupled to receive SE. A first input of OR gate 42 is coupled to receive an output of AND gate 44, and a second input of OR gate 42 is coupled to receive an inverted version of the scan mode signal. An output of OR gate 42 is coupled to the scan enable input, SEN. When SEN is asserted, clock gate 40 does not gate the clock such that the input clock signal to clock gate 40 is provided at the output as core clk. When SEN is negated, clock gate 40 gates the input clock signal in accordance with the input received at EN, such that when EN is asserted, the input clock signal is provided as core clk and when EN is negated, core clk is provided as a logic level low.

A first input of AND gate 46 is coupled to receive the scan mode signal. A Q output of flip flop 52 is coupled to provide synced SE signal to a second input of AND gate 46. When in scan mode (in which the scan mode signal is asserted), AND gate 46 provides synced SE to the control input of MUX 30. When the control input of MUX 30 is asserted, shift clk is provided at the output of MUX 30 and when negated, func clk is provided at the output of MUX 30. Therefore, during functional mode (in which the scan mode signal is negated), the output of AND gate 46 is negated and func clk is provided at the output of MUX 30. A Q output of flip flop 50 is coupled to a D input of flip flop 52, and a D input of flip flop 50 is coupled to an output of NAND gate 48. The clock inputs of flip flops 50 and 52 are coupled to receive inverted versions of func clk. A first input of NAND gate 48 is coupled to receive a capture clock start signal. A D input of flip flop 56 is coupled to receive the capture clock start signal, and an output of flip flop 56 is coupled to a D input of flip flop 58. A Q output of flip flop 58 is coupled to an enable input, en, of delay timer 54. Clock inputs of flip flops 56 and 58 are coupled to receive func clk. Delay timer 54 is coupled to receive delay value 1 at its load data input, and func clk at its clock input. An output of delay timer is coupled to a second input of NAND gate 48. Delay timer 54 loads delay value 1 as its timer value, and upon assertion of the enable input, delay timer 54 decrements the timer value with each pulse of func clk. Upon the timer value reaching 0, delay timer 54 asserts its output. Delay timer 54, flip flops 50, 52, 56, and 58, and NAND gate 48 may be referred to as a clock delay unit 45.

In operation during functional mode (in which the scan mode signal is negated), the output of OR gate 42 is a logic level high, thus asserting the SEN input. This prevents clock gate 40 from gating its clock such that the clock received at the clock input is provided as core clk. When the scan mode signal is negated, MUX 30 selects func clk which is provided to the clock input of clock gate 40, and therefore, func clk is provided, ungated, as core clk at the output of clock gate 40.

Operation during scan mode (in which the scan mode signal is asserted) will be described in combination with FIG. 3 which illustrates various signals of core clock control 24, including func clk, shift clk, synced SE, and core clk 1. Core clk 1 refers to the core clock output by core clock control 24 which is included in core 18. (FIG. 3 also includes core clk 2 and core clk 3 which will be discussed further below and correspond to the core clocks which are output by the core clock control circuitry in each of core 20 and core 22 and which operate analogously to core clock control 24 of core 18.) Referring to FIG. 2, during scan mode, synced SE controls which clk is provided by MUX 30 and SE controls when clock gate 40 performs clock gating.

In scan test mode, during a shift phase in which SE is asserted, scan in test patterns received by core 18 from SoC test controller 12 are shifted into the scan chains of LUT 26. Included in these scan in test patterns is a clock pattern which is provided from the scan in test patterns received from SoC test controller 12 to core clock control 24. The clock pattern is shifted into the clock control chain which includes flip flops 31-38. The shifting of the test patterns into the scan chain and clock control chain (and the shifting out of the output test data from the scan chains) is controlled by shift clk. Note that shift clk may operate at a slower frequency than func clk. Referring to FIG. 2, during the shift phase, the capture clock start signal is negated. Therefore, the output of NAND gate 48 is a logic level 1. This logic level 1 is provided through flip flops 50 and 52 which synchronize the output of NAND gate 48 to the func clk. In the illustrated embodiment, flip flops 50 and 52 are negative edge triggered clocks, therefore, synced SE at the Q output of flip flop 52 matches the D input of flip flop 50 at least by the second falling edge of func clk following a transition of the D input of flip flop 50. With synced SE asserted, MUX 30 provides shift clk at its output in which shift clk is provided to the clock inputs of flip flops 31-38 to shift in the clock pattern, and shift clk is provided as core clk at the output of clock gate 40. Note that with SE asserted (corresponding to the shift phase), SEN is asserted and thus shift clk is provided as core clk without being gated. This core clk is provided to all the scan chains of LUT 26 to shift in the scan in test patterns (while shifting out the previously captured output test data).

Upon completion of the shift phase, SoC test controller 12 begins the capture phase by negating SE. During the capture phase, SoC test controller 12 turns shift clk off (setting it to a logic level low). Also, at some point prior to beginning the capture phase or at the beginning of the capture phase, delay value 1 is loaded into delay timer 54 as a start value for timer 54. Therefore, referring to FIG. 3, upon SE being negated at time t1, shift clk remains at a logic level low. During the capture phase, the scan chains of LUT 26 are configured (by their SE inputs) to operate as they would in functional mode. Core clk provided by clock gate 40 to the scan chains corresponds to func clk as gated by the clock pattern stored in flip flops 31-38. Core clk provided by clock gate 40 during the capture phase may be referred to as the capture clock. In the capture phase, SoC test controller 12 asserts the capture clock start to initiate the count down of delay timer 54 from the start value of delay value 1. Assertion of the capture clock start signal propagates through flip flops 56 and 58 such that enabling of delay timer 54 is synchronized with func clk. With capture clock start asserted, the output of NAND gate 48 will be negated when delay timer 54 reaches 0. Therefore, at a delay of delay value 1 after assertion of the capture clock start (and after two falling edges of func clk due to the synchronization provided by flip flops 50 and 52), synced SE is negated which results in func clk being provided by MUX 30.

With each pulse of the func clk provided by MUX 30, a next clock pattern bit is right shifted by flip flops 31-38 such that a next bit of the clock pattern is provided to the EN input of clock gate 40. If EN is negated (a logic level 0), the core clock is output as a logic level 0, regardless of the value of func clk at the clock input of clock gate 40. If EN is asserted (a logic level 1), the core clock is output to match the value of func clk at the clock input. Therefore, each time a value of 0 of the clock pattern is shifted from flip flop 38 to the EN output, the func clk at the clock input of clock gate 40 is gated resulting in a logic level low at the core clock output for that clock cycle of func clk. Core clk provided by clock gate 40 as controlled by the clock pattern shifted through flip flops 31-38 during the capture phase may be referred to as the functional clock signal pulses. Note that, during the capture phase, prior to synced SE being negated, the shift clk is still provided by MUX 30. However, since the shift clk is off during the capture phase, flip flops 31-38 are not affected prior to synced SE being negated.

Figure 3:
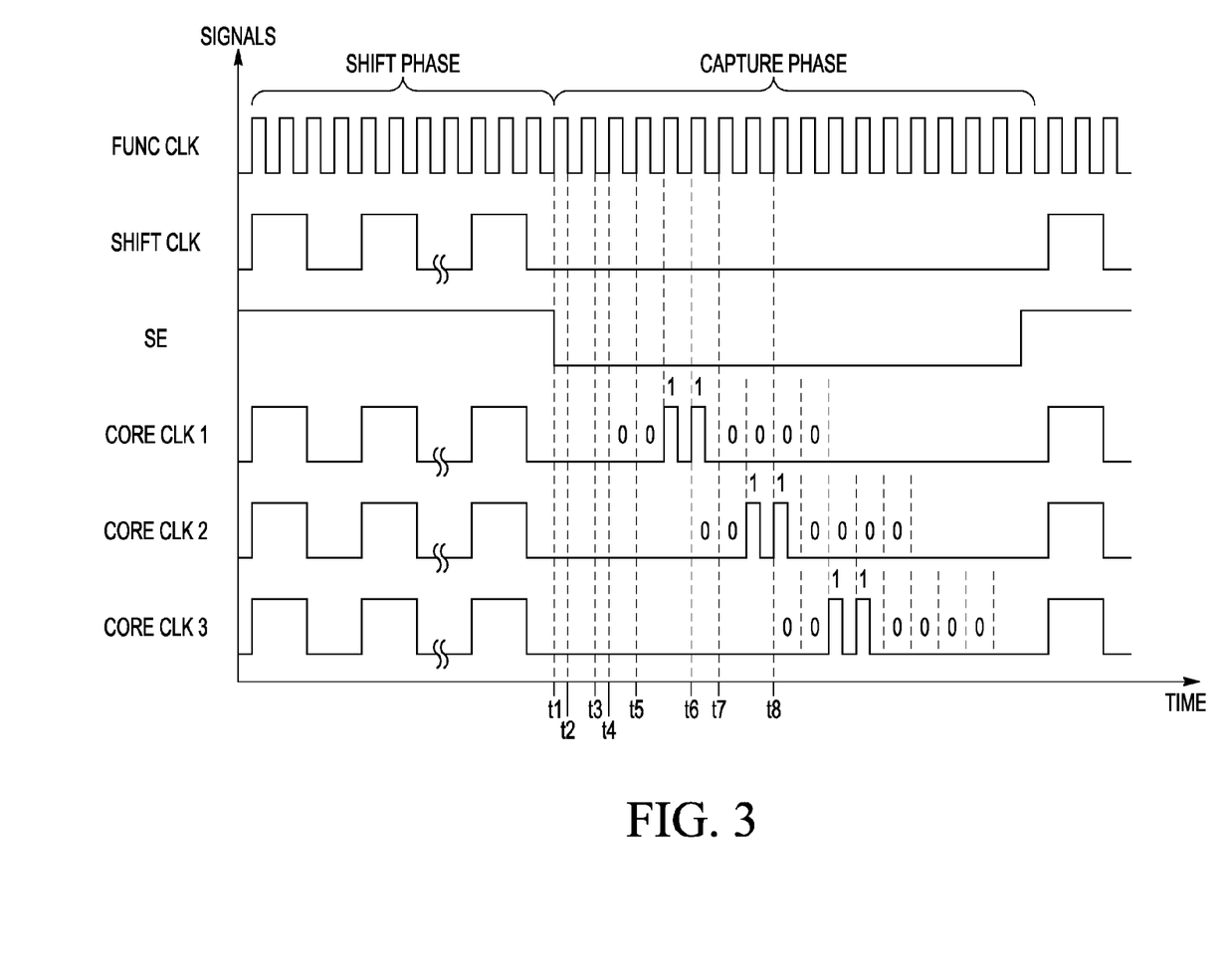
FIG. 3 illustrates, in timing diagram form, values of various signals of the SoC of FIG. 1 in accordance with one embodiment of the present invention.

In the example of FIG. 3, it is assumed that delay value 1 (which is loaded into delay timer 54) is 0 such that, upon deassertion of SE and assertion of capture clock start at time t1, the count down value of delay timer 54 is already at 0 and the output, provided to NAND gate 48, is asserted at a logic level 1. As can be seen in FIG. 3, time t2 and time t3 correspond to the first two falling edges of func clk as the 0 at the output of NAND gate 48 is transmitted to the output of flip flop 52. Therefore, at time t4, synced SE is negated, thus selecting func clk at MUX 30. For the example of FIG. 3, it is assumed that the clock pattern which was shifted into flip flops 31-38 corresponds to 0b00001100, such that, at the end of the shift phase, flip flop 38 stores a 0, flip flop 37 stores a 0, flip flops 36 and 35 each store a 1, and flip flops 31-34 each store a 0. Therefore, at time t4, for the clock pulse of func clk, the value provided to the EN input of clock gate 40 is the value shifted from flip flop 38, which is 0. This results in the core clock (core clk 1) being output as a 0 (since it has been gated by the EN input due to the SEN input of clock gate 40 being a logic level low). At time t4, note the clock pattern in flip flops 31-38 have all been right shifted. Therefore, at time t5, for the clock pulse of func clk, the value provided to the EN input is the value shifted from flip flop 38 (which was previously shifted from flip flop 37), which is again 0. Therefore, core clk 1 is again output as a 0. For the next two clock cycles of func clk after t5, the values shifted from flip flop 38 to the EN input of clock gate 40 are 1, therefore, for these next two clock cycles, the func clk at the clock input is provided as the core clock. Therefore, as seen in FIG. 3, core clk 1 toggles high and then low for each of these two cycles. The remaining clock pattern to be shifted through flip flop 38 includes four 0's, resulting in the core clock being gated to a logic level 0 for these cycles. During the capture phase, the functional clock pulses of core clk 1 as determined by the clock pattern allow LUT 26 to operate as it would in functional mode. After the capture phase is complete, such as after a predetermined amount of time, SoC test controller 12 asserts SE such that new scan in patterns can be shifted in and the captured test values can be scanned out.

Since delay value 1 loaded as the start value into delay timer 54 is 0 for core clk 1, the delay between asserting the capture clock start signal and core clk 1 being determined by the clock pattern in flip flops 31-38 is the delay provided by flip flops 50 and 52 without any additional delay provided by delay timer 54. (Although, note that in alternate embodiments, there may be one or more clock cycle delays introduced by additional gating which may be present, such as additional gating on the output of delay timer 54 to ensure that assertion of the delay timer output occurs with proper timing with respect to the capture clock start signal.) However, by setting delay value 1 to different values (greater than 0), additional delay can be added between assertion of the capture clock start signal and negation of synced SE by delay timer 54. Upon the negation of synced SE, the values of flip flops 31-38 are provided to EN of clock gate 40 in response to func clk to generate core clk.

Referring to FIG. 3, the delay timers in each of core 20 and core 22 are set to different start values provided by SoC test controller 12 as delay value 2 and delay value 3, respectively. In each of core 20 and 22, a core clock control analogous to core clock control 24 is used to provide core clk 2 and core clk 3, respectively. Referring first to core clk 2, delay value 2 is loaded as the start time into the delay timer. At time t5 (delayed from assertion of the capture clock start signal which begins count down of delay timer 54), the delay timer completes the count down from delay value 2, at which point the output of delay timer 54 is asserted. This results in the output of the NAND gate analogous to NAND gate 48 to be negated, and synced SE within the core clock control of core 20 is negated after two subsequent falling clock cycles of func clk. Therefore, at time t6, the clock pattern in the clock control chain (analogous to flip flops 31-38) is used to selectively gate func clk and produce functional cycles of core clk 2 for the capture phase, as illustrated in FIG. 3. Time t6 includes the delay provided by synchronization flip flops (analogous to flips flops 50 and 52) in addition to the delay provided by the delay timer (analogous to delay timer 54). Referring next to core clk 3, delay value 3 is loaded as the start time into delay timer 54. At time t7 (delayed from assertion of the capture clock start signal), delay timer 54 completes the count down from delay value 3, at which point the output of delay timer 54 is asserted. This results in synced SE being negated after two falling clock cycles of func clk such that at time t8, the clock pattern in the clock control chain is used to selectively gate func clk to produce functional cycles of core clk 3 during the capture phase, as illustrated in FIG. 3.

During scan testing, SoC test controller 12 may perform scan testing of cores 18, 20, and 22 in parallel. For example, the same SE signal and capture clock start signal is provided to all cores to control the shift and capture phases. Therefore, the shift and capture phases occur in parallel with control of the SE and capture clock start signals. As seen in FIG. 3, each core clock (core clk 1, core clk 2, and core clk 3) result in a same pattern of functional pulses during the capture phase but staggered in alignment from each other since delay value 1, delay value 2, and delay value 3 are different values. Even though the resulting core clocks used during the capture phase of scan testing are staggered from each other, note that SoC test controller 12 provides the same scan in test patterns, including the same clock pattern, to each of the cores (cores 18, 20, and 22). Therefore, by SoC test controller 12 providing different delay values to each core for the delay timer of the core clock control, the core clocks can be staggered across cores during the capture phase, thus reducing potential IR issues, without needing to provide different clock patterns to each core of the SoC.

Note that in alternate embodiments, different delay circuitry may be used to implement the clock delay unit (such as clock delay unit 45) to provide the desired delay. For example, delay timer 54 can be implemented as a counter or other type of circuitry used to provide a programmable delay based on a delay value provided by SoC test controller 12. Also, different types of synchronization circuitry may be used in place of flip flops 50, 52, 56, and 58. The clock control chain including flip flops 31-38 may be of any length to accommodate any length clock pattern, and other types of control circuitry may be used to control the control input of MUX 30 and the SEN input of clock gate 40 while still achieving the same functionality.

As illustrated in FIG. 1, each core includes logic under test on which the scan testing is performed. However, the logic under test (also referred to as test circuits) may be a part of any type of circuitry being tested. Cores of an SoC are only one example of test circuits.

Therefore, by now it can be appreciated how an SoC test controller can maintain scan testing efficiency by providing a same set of scan in patterns, including clock patterns, to different cores or test circuits of an SoC while reducing IR issues by providing different delay values to each core. The use of the delay timer within the core clock control of each core to provide programmable delays based on the delay values provided by the SoC controller allows for the staggering of clock patterns across the different cores.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The symbol "%" or "0b" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Also, in one embodiment, the illustrated elements of system 10 are circuitry located on a single integrated circuit or within a same device.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, rather than a count down timer for delay timer 54, a counter which counts up from one value to another may be used to provide the desired delay. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a system on chip (SOC) test system includes a first test circuit comprising a first test clock control (TCC) circuit; and a second test circuit including a second TCC circuit. The first and second test circuits are configured to receive a first test pattern and a functional clock signal. The first TCC circuit is configured to generate a first capture clock signal that comprises a set of functional clock signal pulses generated according to a first clock pattern of the first test pattern, and the second TCC circuit is configured to generate a second capture clock signal that includes the set of functional clock signal pulses generated according to the first clock pattern. The set of functional clock signal pulses of the second capture clock signal are staggered in time from the set of functional clock signal pulses of the first capture clock signal. In one aspect, the first TCC circuit is configured to receive a first delay value indicating a first delay period, the second TCC circuit is configured to receive a second delay value indicating a second delay period, the second delay period is not equal to the first delay period, the first TCC circuit is configured to output the set of functional clock signal pulses subsequent to the first delay period, and the second TCC circuit is configured to output the set of functional clock signal pulses subsequent to the second delay period. In a further aspect, the first and second capture clock signals are generated in parallel during a capture phase, and the first and second delay periods are measured from an initial start point of the capture phase. In an even further aspect, the first test circuit comprises a first logic under test (LUT) circuit and the second test circuit comprises a second LUT circuit, the first and second LUT circuits are configured to respectively receive the first and second capture clock signals, and the first and second test circuits are configured to respectively test the first and second LUT circuits in parallel during the capture phase. In another aspect of the above embodiment, the first TCC circuit includes a first shift register, the second TCC circuit includes a second shift register, the first and second TCC circuits are configured to respectively load the first clock pattern into the first and second shift registers, and the first clock pattern is respectively loaded in parallel during a shift-in phase. In a further aspect, the first and second TCC circuits are configured to respectively load a second clock pattern in parallel during a second shift-in phase, and the second clock pattern is one of a different clock pattern or a same clock pattern as the first clock pattern. In yet another aspect of the above embodiment, the first and second TCC circuits are configured to respectively generate a first shift clock signal and a second shift clock signal, the first and second shift clock signals are generated in parallel during a shift-in phase, and the first and second test circuits are configured to respectively load the first test pattern into a first set of scan registers and a second set of scan registers during the shift-in phase. In a further aspect, the first and second shift clock signals are further generated in parallel during a shift-out phase, and the first and second test circuits are configured to respectively unload first and second results of the first test pattern during the shift-out phase. In yet a further aspect, the first and second test circuits are configured to respectively load a second test pattern in parallel during a second shift-in phase, and the second shift-in phase occurs simultaneously with the shift-out phase. In yet another aspect of the above embodiment, the SoC test system further includes a system on chip (SOC) test controller coupled to the first and second test circuits, the SOC test controller configured to provide the first test pattern to the first and second test circuits and receive results of the first test pattern. In yet another aspect of the above embodiment, the SOC test controller system further includes a third test circuit including a third test clock control (TCC) circuit, the third test circuit configured to receive the first test pattern and the functional clock signal, and the third TCC circuit is configured to generate a third capture clock signal, wherein the third capture clock signal comprises the set of functional clock signal pulses generated according to the first clock pattern, and the set of functional clock signal pulses of the third capture clock signal are staggered in time from the set of functional clock signal pulses of the first and second capture clock signals.

In another embodiment, a method includes receiving, by a first test circuit and a second test circuit, a first test pattern and a functional clock signal; generating, by a first test clock control (TCC) circuit of the first test circuit, a first capture clock signal, wherein the first capture clock signal includes a set of functional clock signal pulses generated according to a first clock pattern of the first test pattern; and generating, by a second TCC circuit of the second test circuit, a second capture clock signal, wherein the second capture clock signal includes the set of functional clock signal pulses generated according to the first clock pattern, and the set of functional clock signal pulses of the second capture clock signal are staggered in time from the set of functional clock signal pulses of the first capture clock signal. In one aspect, the method further includes receiving, by the first TCC circuit, a first delay value indicating a first delay period; receiving, by the second TCC circuit, a second delay value indicating a second delay period, wherein the second delay period is not equal to the first delay period; outputting, by the first TCC circuit, the set of functional clock signal pulses subsequent to the first delay period; and outputting, by the second TCC circuit, the set of functional clock signal pulses subsequent to the second delay period. In a further aspect, the first and second capture clock signals are generated in parallel during a capture phase, and the first and second delay periods are measured from an initial start point of the capture phase. In yet a further aspect, the method further includes testing a first logic under test (LUT) circuit during the capture phase, wherein the testing the first LUT circuit is performed by the first test circuit; and testing a second LUT circuit during the capture phase, wherein the testing the second LUT circuit is performed by the second test circuit, the first and second LUT circuits are configured to respectively receive the first and second capture clock signals, and the testing the first and second LUT circuits is performed in parallel during the capture phase. In another aspect, the method further includes loading, by the first TCC circuit, the first clock pattern into a first shift register of the first TCC circuit; and loading, by the second TCC circuit, the first clock pattern into a second shift register of the second TCC circuit, wherein the first clock pattern is respectively loaded in parallel during a shift-in phase. In a further aspect, the method further includes loading, by the first and second TCC circuits, a second clock pattern in parallel during a second shift-in phase, wherein the second clock pattern is one of a different clock pattern or a same clock pattern as the first clock pattern. In another aspect, the method further includes generating, by the first and second TCC circuits, a first shift clock signal and a second shift clock signal, respectively, wherein the first and second shift clock signals are generated in parallel during a shift-in phase; and loading, by the first and second test circuits, the first test pattern into a first set of scan registers and a second set of scan registers, respectively, during the shift-in phase. In a further aspect, the method further includes generating, by the first and second TCC circuits, the first and second shift clock signals, respectively, in parallel during a shift-out phase; and unloading, by the first and second test circuits, first and second results of the first test pattern, respectively, during the shift-out phase. In yet a further aspect, the method further includes loading, by the first and second test circuits, a second test pattern in parallel during a second shift-in phase, wherein the second shift-in phase occurs simultaneously with the shift-out phase.

What is claimed is:

1. A system on chip (SOC) test system comprising:
a first test circuit comprising a first test clock control (TCC) circuit; and
a second test circuit comprising a second TCC circuit, wherein
the first and second test circuits are configured to receive a first test pattern and a functional clock signal,
the first TCC circuit is configured to
generate a first capture clock signal that comprises a set of functional clock signal pulses generated according to a first clock pattern of the first test pattern, and
the second TCC circuit is configured to
generate a second capture clock signal that comprises the set of functional clock signal pulses generated according to the first clock pattern, wherein
the set of functional clock signal pulses of the second capture clock signal are staggered in time from the set of functional clock signal pulses of the first capture clock signal.

2. The SOC test system of claim 1, wherein
the first TCC circuit is configured to receive a first delay value indicating a first delay period,
the second TCC circuit is configured to receive a second delay value indicating a second delay period,
the second delay period is not equal to the first delay period,
the first TCC circuit is configured to output the set of functional clock signal pulses subsequent to the first delay period, and
the second TCC circuit is configured to output the set of functional clock signal pulses subsequent to the second delay period.

3. The SOC test system of claim 2, wherein
the first and second capture clock signals are generated in parallel during a capture phase, and
the first and second delay periods are measured from an initial start point of the capture phase.

4. The SOC test system of claim 3, wherein
the first test circuit comprises a first logic under test (LUT) circuit and the second test circuit comprises a second LUT circuit,
the first and second LUT circuits are configured to respectively receive the first and second capture clock signals, and
the first and second test circuits are configured to respectively test the first and second LUT circuits in parallel during the capture phase.

5. The SOC test system of claim 1, wherein
the first TCC circuit comprises a first shift register,
the second TCC circuit comprises a second shift register,
the first and second TCC circuits are configured to respectively load the first clock pattern into the first and second shift registers, and
the first clock pattern is respectively loaded in parallel during a shift-in phase.

6. The SOC test system of claim 5, wherein
the first and second TCC circuits are configured to respectively load a second clock pattern in parallel during a second shift-in phase, and
the second clock pattern is one of a different clock pattern or a same clock pattern as the first clock pattern.

7. The SOC test system of claim 1, wherein
the first and second TCC circuits are configured to respectively generate a first shift clock signal and a second shift clock signal,
the first and second shift clock signals are generated in parallel during a shift-in phase, and
the first and second test circuits are configured to respectively load the first test pattern into a first set of scan registers and a second set of scan registers during the shift-in phase.

8. The SOC test system of claim 7, wherein
the first and second shift clock signals are further generated in parallel during a shift-out phase, and
the first and second test circuits are configured to respectively unload first and second results of the first test pattern during the shift-out phase.

9. The SOC test system of claim 8, wherein
the first and second test circuits are configured to respectively load a second test pattern in parallel during a second shift-in phase, and
the second shift-in phase occurs simultaneously with the shift-out phase.

10. The SOC test system of claim 1, further comprising:
a system on chip (SOC) test controller coupled to the first and second test circuits, the SOC test controller configured to provide the first test pattern to the first and second test circuits and receive results of the first test pattern.

11. The SOC test system of claim 1, further comprising:
a third test circuit comprising a third test clock control (TCC) circuit,
the third test circuit configured to receive the first test pattern and the functional clock signal, and
the third TCC circuit is configured to
generate a third capture clock signal, wherein
the third capture clock signal comprises the set of functional clock signal pulses generated according to the first clock pattern, and
the set of functional clock signal pulses of the third capture clock signal are staggered in time from the set of functional clock signal pulses of the first and second capture clock signals.

12. A method comprising:
receiving, by a first test circuit and a second test circuit, a first test pattern and a functional clock signal;
generating, by a first test clock control (TCC) circuit of the first test circuit, a first capture clock signal, wherein
the first capture clock signal comprises a set of functional clock signal pulses generated according to a first clock pattern of the first test pattern; and
generating, by a second TCC circuit of the second test circuit, a second capture clock signal, wherein
the second capture clock signal comprises the set of functional clock signal pulses generated according to the first clock pattern, and
the set of functional clock signal pulses of the second capture clock signal are staggered in time from the set of functional clock signal pulses of the first capture clock signal.

13. The method of claim 12, further comprising:
receiving, by the first TCC circuit, a first delay value indicating a first delay period;
receiving, by the second TCC circuit, a second delay value indicating a second delay period, wherein
the second delay period is not equal to the first delay period;
outputting, by the first TCC circuit, the set of functional clock signal pulses subsequent to the first delay period; and
outputting, by the second TCC circuit, the set of functional clock signal pulses subsequent to the second delay period.

14. The method of claim 13, wherein
the first and second capture clock signals are generated in parallel during a capture phase, and
the first and second delay periods are measured from an initial start point of the capture phase.

15. The method of claim 14, further comprising:
testing a first logic under test (LUT) circuit during the capture phase, wherein the testing the first LUT circuit is performed by the first test circuit; and
testing a second LUT circuit during the capture phase, wherein
the testing the second LUT circuit is performed by the second test circuit,
the first and second LUT circuits are configured to respectively receive the first and second capture clock signals, and
the testing the first and second LUT circuits is performed in parallel during the capture phase.

16. The method of claim 12, further comprising:
loading, by the first TCC circuit, the first clock pattern into a first shift register of the first TCC circuit; and
loading, by the second TCC circuit, the first clock pattern into a second shift register of the second TCC circuit, wherein
the first clock pattern is respectively loaded in parallel during a shift-in phase.

17. The method of claim 16, further comprising:
loading, by the first and second TCC circuits, a second clock pattern in parallel during a second shift-in phase, wherein
the second clock pattern is one of a different clock pattern or a same clock pattern as the first clock pattern.

18. The method of claim 12, further comprising:
generating, by the first and second TCC circuits, a first shift clock signal and a second shift clock signal, respectively, wherein
the first and second shift clock signals are generated in parallel during a shift-in phase; and
loading, by the first and second test circuits, the first test pattern into a first set of scan registers and a second set of scan registers, respectively, during the shift-in phase.

19. The method of claim 18, further comprising:
generating, by the first and second TCC circuits, the first and second shift clock signals, respectively, in parallel during a shift-out phase; and
unloading, by the first and second test circuits, first and second results of the first test pattern, respectively, during the shift-out phase.

20. The method of claim 19, further comprising:
loading, by the first and second test circuits, a second test pattern in parallel during a second shift-in phase, wherein
the second shift-in phase occurs simultaneously with the shift-out phase.

* * * * *